US008138759B2

(12) United States Patent
Greiser et al.

(10) Patent No.: US 8,138,759 B2
(45) Date of Patent: Mar. 20, 2012

(54) SYSTEM FOR ADJUSTING A MAGNETIC FIELD FOR MR AND OTHER USE

(75) Inventors: Andreas Greiser, Erlangen (DE); Renate Jerecic, Shanghai (CN); Peter Kellman, Bethesda, MD (US); Saurabh Shah, Chicago, IL (US); Peter Weale, Chicago, IL (US); Sven Zuehlsdorff, Chicago, IL (US)

(73) Assignees: The United States of America as represented by the Secretary, Department of Health and Human Services, Washington, DC (US); Siemens Medical Solutions USA, Inc., Malvern, PA (US)

( * ) Notice: Subject to any disclaimer, the term of this patent is extended or adjusted under 35 U.S.C. 154(b) by 408 days.

(21) Appl. No.: 12/577,644

(22) Filed: Oct. 12, 2009

(65) Prior Publication Data

US 2010/0127702 A1    May 27, 2010

Related U.S. Application Data

(60) Provisional application No. 61/117,667, filed on Nov. 25, 2008.

(51) Int. Cl.
*G01V 3/00* (2006.01)

(52) U.S. Cl. ....................................... 324/309

(58) Field of Classification Search .......... 324/300–322; 600/410–435; 382/100–154
See application file for complete search history.

(56) References Cited

OTHER PUBLICATIONS

Hernando et al, Joint Estimation of Water/Fat Images and Field Inhomogeneity Map, Magnetic Resonance in Medicine, 2008, pp. 571-580, vol. 59, Wiley-Liss, Inc.

Kellerman et al, Multi-echo Dixon Fat and Water Separation Method for Detecting Fibro-fatty Infiltration in the *Myocardium*, Proc. Intl. Mag. Reson. Med., 2008, p. 823, vol. 16.

Koch et al., Optimization of Static Magnetic Field Homogeneity in the Human and Animal Brain in Vivo, Prog. Nucl. Mag. Reson Specto., 2009, pp. 69-96, vol. 54.

Bluemke et al., MR Imaging of Arrhythmogenic Right Ventricular Cardiomyopathy: Morphologic Findings and Interobserver Reliability, Cardiology 2003, pp. 153-162, vol. 99, Karger.

W. Thomas Dixon, Ph.D, Simple Proton Spectroscopic Imaging, Radiology 1984, pp. 189-194, vol. 153.

Juchem et al., Combined Passive and Active Shimming for in vivo MR Spectroscopy at High Magnetic Fields, Journal of Mag. Reson. 2006, pp. 278-289, vol. 183, Elsevier Inc.

Schneider et al, Rapid inVivo Proton Shimming, Mag. Reson. Med. 1991, pp. 335-347, vol. 18.

(Continued)

*Primary Examiner* — Dixomara Vargas
(74) *Attorney, Agent, or Firm* — Alexander J Burke

(57) ABSTRACT

An MR magnetic field inhomogeneity compensation system acquires multiple MR data sets representing luminance intensity values of individual image elements comprising corresponding multiple different image versions of at least a portion of a first imaging slice of patient anatomy including fat and water components. The compensation system employs the multiple MR data sets in solving corresponding multiple simultaneous nonlinear equations to calculate local frequency offset associated with magnetic field inhomogeneity at the individual image element location, for an individual image element of the image elements. The local frequency offset comprises a difference between proton spin frequency at the location and a nominal proton spin frequency. The compensation system derives data representing an electrical signal to be applied to magnetic field generation coils to substantially compensate for determined offset frequencies at the plurality of individual locations. A magnetic field generation coil generates a magnetic field in response to applying the electrical signal to substantially compensate for the magnetic field inhomogeneity at the individual image element location.

15 Claims, 12 Drawing Sheets

OTHER PUBLICATIONS

Kellerman et al., Phase-Sensitive Inversion Recovery for Detecting Myocardial Infarction Using Gadolinium-Delayed Hyperenhancement, Magnet. Reson. Med., 2002, pp. 372-383, vol. 47 Wiley-Liss Inc.

Pineda et al, Cramer-Rao Bounds for Trhee-Point Decomposition of Water and Fat, Mag. Reson. Med., 2005, vol. 54, pp. 625-635, Wiley-Liss Inc.

Reeder et al., Iterative Decomposition of Water and Fat With Echo Asymmetry and Least-Squares Estimation (IDEAL): Application With Fast Spin-Echo Imaging, Mag. Reson. Med, 2005, vol. 54 pp. 636-644, Wiley-Liss Inc.

Goldfarb et al., T1-Weighted Magnetic Resonance Imaging Shows Fatty Deposition After Myocardial Infarction, Mag. Res. Med., 2007, vol. 57, pp. 828-834, Wiley-Liss Inc.

Reeder et al., Multicoil Dixon chemical Species Separation With an Iterative Least-Squares Estimation Method, Mag. Reson. Med, 2004, vol. 51, pp. 35-45, Wiley-Liss Inc.

Webb et al., Paid, Fully Automatic, Arbitrary-Volume in Vivo Shimming, Mag. Reson. Med., 1991, vol. 20, pp. 113-122, Academic Press, Inc.

10

SYSTEM FOR ADJUSTING A MAGNETIC FIELD FOR MR AND OTHER USE

This is a non-provisional application of provisional application Ser. No. 61/117,667 filed Nov. 25, 2008, by S. Zuehlsdorff et al.

FIELD OF THE INVENTION

This invention concerns a system for automatically dynamically compensating for inhomogeneity and variability in an MR imaging device magnetic field resulting from patient anatomical variation and other sources.

BACKGROUND OF THE INVENTION

Cardiovascular diseases are a leading cause of death that is addressed by the use of advanced medical imaging modality devices involving repetitive patient screening for early disease detection to improve prognosis. Therefore a non-invasive and non-radiating imaging technique such as MRI (magnetic resonance imaging) is useful for diagnosis as it is devoid of risks and long-term side effects to the patient and provides excellent disease specific soft-tissue contrast with specific pulse sequences. Also in MRI, motion can severely degrade image quality and cardiac applications encounter a highly adverse environment due to both cardiac and respiratory motion. Therefore, ultra fast gradient echo imaging techniques such as TrueFISP (Fast Imaging with Steady State Precession) or turboFLASH (Fast Low-Angle Shot) sequences are utilized for cardiac MRI to minimize the adverse effects of motion. However, unlike spin echo sequences, these classes of sequences are sensitive to magnetic field inhomogeneities. Image quality may be compromised by typical flow artifacts or banding artifacts and the artifacts increase with the increase in field strength (e.g., >=3.0T).

The magnetic field inhomogeneity in known clinical MR scanners is typically minimized using both a static shim and a dynamic shim. A static hardware shim is employed after installation of an MRI scanner to compensate for compromised homogeneity of a main magnetic field due to field distortions in an RF and magnetically shielded room at an installation site. Strategically placed shimming plates within the bore of the scanner improve the homogeneity. A dynamic shim comprising generated higher order magnetic field gradients is employed to compensate for dynamic inhomogeneities that are identified by measurement. Insertion of an object or person into a magnet bore distorts a local magnetic field due to susceptibility discontinuities. In particular, in a cardiac study, for example, numerous tissue interfaces, such as interfaces between, lung and myocardium, liver and lung are unavoidable, resulting often in severe inhomogeneities over a region of interest. Measurements are performed of the magnetic field over an anatomical region of interest and corresponding field gradients needed to counter-balance and subsequently homogenize the field are calculated. In order to perform a dynamic shim, a dedicated MRI sequence is used to estimate the main magnetic field. Typically, a multi-echo sequence, such as a DESS (double echo steady state) pulse sequence, is applied in a three dimensional fashion. The accumulation of phase between two echoes is proportional to the main magnetic field at this location and can be used for field estimation.

In known MRI systems, a generated magnetic field for data collection is typically not-synchronized with cardiac motion or with respiratory motion. As a result, magnetic field estimation of a region of interest for cardiac applications (of the heart) is not reliable. Furthermore, MRI signals originating from chemically shifted protons (such as subcutaneous, epicardial and visceral fat) result in additional phase accumulation and compromise the field estimation. A system according to invention principles addresses these deficiencies and related problems.

SUMMARY OF THE INVENTION

A system shims a main magnetic field of a magnetic resonance imaging (MRI) scanner for cardiac and other applications by applying a pulse sequence and reconstruction process that is insensitive to cardiac and respiratory motion and provides a reliable estimation of a magnetic field in a region of interest (ROI) such as the heart and the surrounding anatomy. A system automatically dynamically compensates for inhomogeneity and variability in an MR imaging device magnetic field resulting from patient anatomical variation and other sources. The system includes an MR imaging compensation system for, acquiring multiple MR data sets representing luminance intensity values of individual image elements comprising corresponding multiple different image versions of at least a portion of a first imaging slice of patient anatomy including fat and water components. The compensation system employs the multiple MR data sets in solving corresponding multiple simultaneous nonlinear equations to calculate local frequency offset associated with magnetic field inhomogeneity at the individual image element location, for an individual image element of the image elements. The local frequency offset comprises a difference between proton spin frequency at the location and a nominal proton spin frequency. The compensation system derives data representing an electrical signal to be applied to magnetic field generation coils to substantially compensate for determined offset frequencies at the plurality of individual locations. A magnetic field generation coil generates a magnetic field in response to applying the electrical signal to substantially compensate for the magnetic field inhomogeneity at the individual image element location.

DETAILED DESCRIPTION OF THE INVENTION

A system shims a main magnetic field of a magnetic resonance imaging (MRI) scanner for cardiac and other applications by applying a pulse sequence and reconstruction process that is insensitive to cardiac and respiratory motion and provides a reliable estimation of a magnetic field in a region of interest (ROI) such as the heart and the surrounding anatomy. The system corrects static magnetic field inhomogeneities in anatomical regions where dynamic motion is present. For example, in cardiac MRI, It is difficult to obtain a reasonable estimate of the variations in a main magnetic field ($B_0$) due to the presence of respiratory and cardiac motion. A shimming sequence advantageously employed by the system collects multiple 2D (two dimensional) slices or a 3D (three dimensional) volume over multiple heartbeat cycles. Using ECG gating, the system restricts data acquisition to quiescent periods of a cardiac cycle, eliminating cardiac motion dependence. A well established single shot approach (without breathhold) or a segmented acquisition (with breathhold) may be used to remove respiratory motion dependence. For each slice/slab at least N+1 MR signal echoes are acquired, where N is number of chemical species present within an anatomical region of interest (protons in water and fat are dominating species in-vivo imaging). The magnitude and phase information present in N+1 echoes are combined using a reconstruction process to estimate magnetic field for N chemical species and an accurate magnetic field map of local field inhomogeneities. System 10 uses the field map to perform a shimming procedure of the static magnetic field in a region of interest (ROI).

Figure 1:
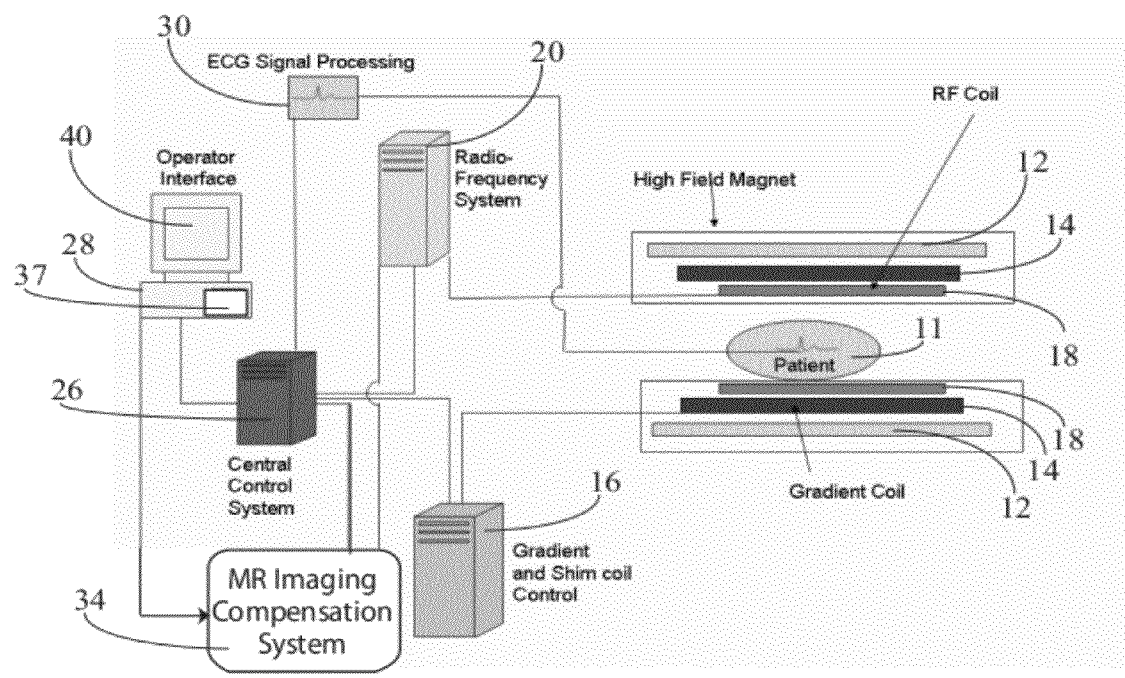
FIG. 1 shows a system for automatically dynamically compensating for inhomogeneity and variability in an MR imaging device magnetic field resulting from patient anatomical variation and other sources, according to invention principles.

FIG. 1 shows system 10 for automatically dynamically compensating for inhomogeneity and variability in an MR imaging device magnetic field resulting from patient anatomical variation and other sources. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates pulse sequences. The shimmed gradients compensate for inhomogeneity and variability in an MR imaging device magnetic field resulting from patient anatomical variation and other sources and are generated in response to electrical signals provided by MR imaging magnetic field compensation system 34. The magnetic field gradients include a slice-selection gradient magnetic field, a phase-encoding gradient magnetic field and a readout gradient magnetic field that are applied to patient 11. Further RF (radio frequency) module 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 to provide image representative data to an image data processor in central control unit 26. ECG synchronization signal generator 30 provides ECG signals used for pulse sequence and imaging synchronization. MR imaging compensation system 34 automatically dynamically compensates for inhomogeneity and variability in the MR imaging device magnetic field resulting from patient anatomical variation and other sources. System 34 acquires multiple MR data sets representing luminance intensity values of individual image elements comprising corresponding multiple different image versions of at least a portion of a first imaging slice of patient anatomy including fat and water components. For an individual image element of the image elements, compensation system 34 employs the multiple MR data sets in solving corresponding multiple simultaneous nonlinear equations to calculate local frequency offset associated with magnetic field inhomogeneity at the individual image element location and comprising a difference between proton spin frequency at the location and a nominal proton spin frequency. System 34 derives data representing an electrical signal to be applied to magnetic field generation coils to substantially compensate for determined offset frequencies at multiple individual locations. MR magnetic field coils 14 generate a magnetic field in response to applying the electrical signal to substantially compensate for the magnetic field inhomogeneity at the individual image element location.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

In known cardiac MRI, cardiac motion is eliminated by limiting data acquisition to a relatively stationary part of a cardiac cycle. Typically, patients are asked to hold their breath for the duration of acquisition to eliminate any respiratory motion. However, as 3D coverage is typically desired over an entire heart to obtain a magnetic field map indicating inhomogeneity, it is typically not possible to acquire the 3D volume in a single breathhold. System 10 advantageously addresses this limitation by acquiring a stack of 2D image slices covering a region of interest. System 10 acquires single shot 2D images in response to a trigger in a non segmented fashion. The breath hold duration required for acquisition of 3D images is often prohibitively long. System 10 is employed in imaging patients presenting with arrhythmia (irregular heart beats) where image quality of a corresponding 3D image data set may be degraded. As a field map requires relatively low resolution, data collection is relatively fast and individual 2D image slices are acquired within quiescent periods of a cardiac cycle. Moreover, due to a less demanding resolution requirement, thicker slices may be used and an entire heart can be covered with a small number of slices, therefore making breath hold duration shorter. Optionally, single shot 2D slices may be acquired using a free breathing and non-ECG triggered protocol. The image quality of each individual 2D slice is not compromised since the data acquisition is performed rapidly.

Within a human body, water and fat protons are the two chemical species which generate dominant MR signals. In the presence of magnetic field inhomogeneity, the signal from a voxel may be characterized using Equation 1, $$s(t_n) = \rho_w e^{i2\pi\Delta f_B t_n} + \rho_f e^{i2\pi(\Delta f_B + \Delta f_f)t_n}$$

Where $t_n$ is the echo time. The water component has intensity $\rho_w$ and is assumed to be exactly on resonance, while the fat component has intensity $\rho_f$ with a known frequency shift $\Delta f_f$ (in Hz). $\Delta f_B$ is the local frequency offset due to field inhomogeneity. This equation is non-linear with three unknowns: $\rho_w$, $\rho_f$ and $\Delta f_B$. Other embodiments employ other equations and advanced signal models that include T2* relaxation time and/or multipeak fat models. Therefore, to eliminate the error in the field map estimation due to chemical shift effects, at least three echoes are acquired. The use of three or more echoes allows a reliable separation of phase effects due to field inhomogeneity and chemical shift of fat protons. Known image reconstruction algorithms such as a variable projection (VARPRO) algorithm robustly reconstruct water-only and fat-only images using an estimated main magnetic field. The resultant estimate of the static magnetic field in turn can be used for a subsequent shimming process. A system 10 multi-echo acquisition provides a reliable magnetic field estimation without relying on fat saturation methods that in turn have a stringent requirement for use of a homogeneous magnetic field.

Figure 2:
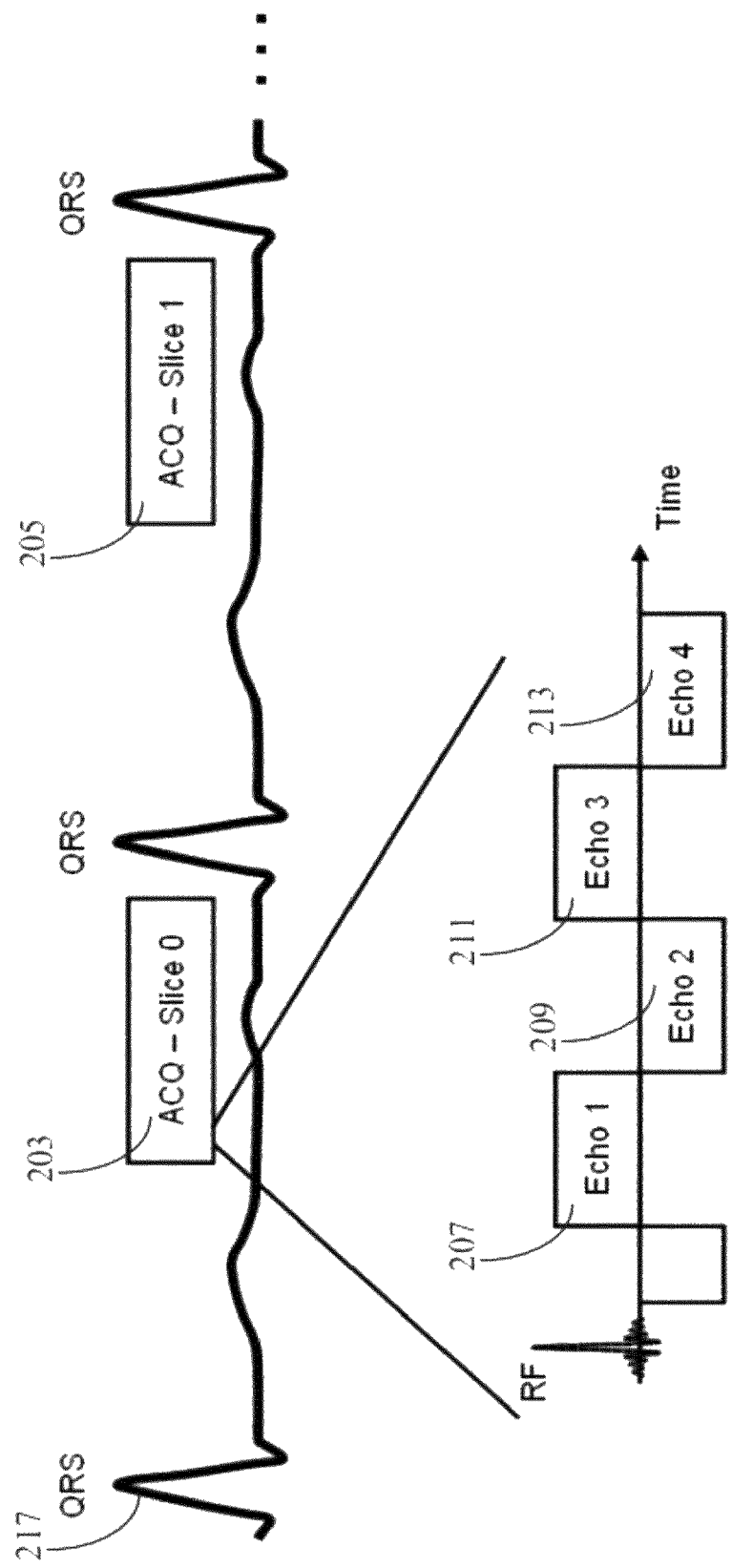
FIG. 2 shows a pulse sequence and process employed by a system for automatically dynamically compensating for inhomogeneity and variability in an MR imaging device magnetic field, according to invention principles.

FIG. 2 shows a pulse sequence and process employed by system 10 (FIG. 1) for automatically dynamically compensating for inhomogeneity and variability in an MR imaging device magnetic field. In this embodiment, four imaging echoes 207, 209, 211 and 213 (using monoplane or bipolar acquisition) acquire a single k-space line of a first imaging slice 203 using a multi-slice single shot protocol. K-space is the temporary image space in which data from digitized MR signals is stored during data acquisition and comprises raw data in a spatial frequency domain before reconstruction. When k-space is full (at the end of an MR scan), the data is mathematically processed to produce a final image. The pulse sequence is synchronized with an ECG signal 217 provided by signal generator 30 to acquire MR data during a rest phase of a heart cycle, which improves data accuracy by minimizing cardiac motion artifacts in the acquired data.

Multiple k-space lines comprising an individual slice such as first imaging slice 203 are acquired during a single heart cycle. Four imaging echoes are used (such as echoes 207, 209, 211 and 213) to acquire four image data representations of a single k-space line and generate four simultaneous nonlinear equations, for example, used to calculate local frequency offset associated with magnetic field inhomogeneity at an individual image element location (a spatial location associated with a k-space line such as a pixel). At least three simultaneous equations (and echoes) are used for fat and water separation and to calculate local frequency offset using Equation 1, for example, to enable magnetic field estimation using a reconstruction algorithm like VARPRO. System 10 employs a pulse sequence comprising multiple sequential k-space line acquisitions individually comprising a four echo imaging acquisition to acquire an individual slice in a heart cycle. The system acquires a sequence of slices in a corresponding sequence of heart cycle so a first slice 203 is acquired in a first cycle, a second slice 205 is acquired in a second cycle and so on.

Figure 3:
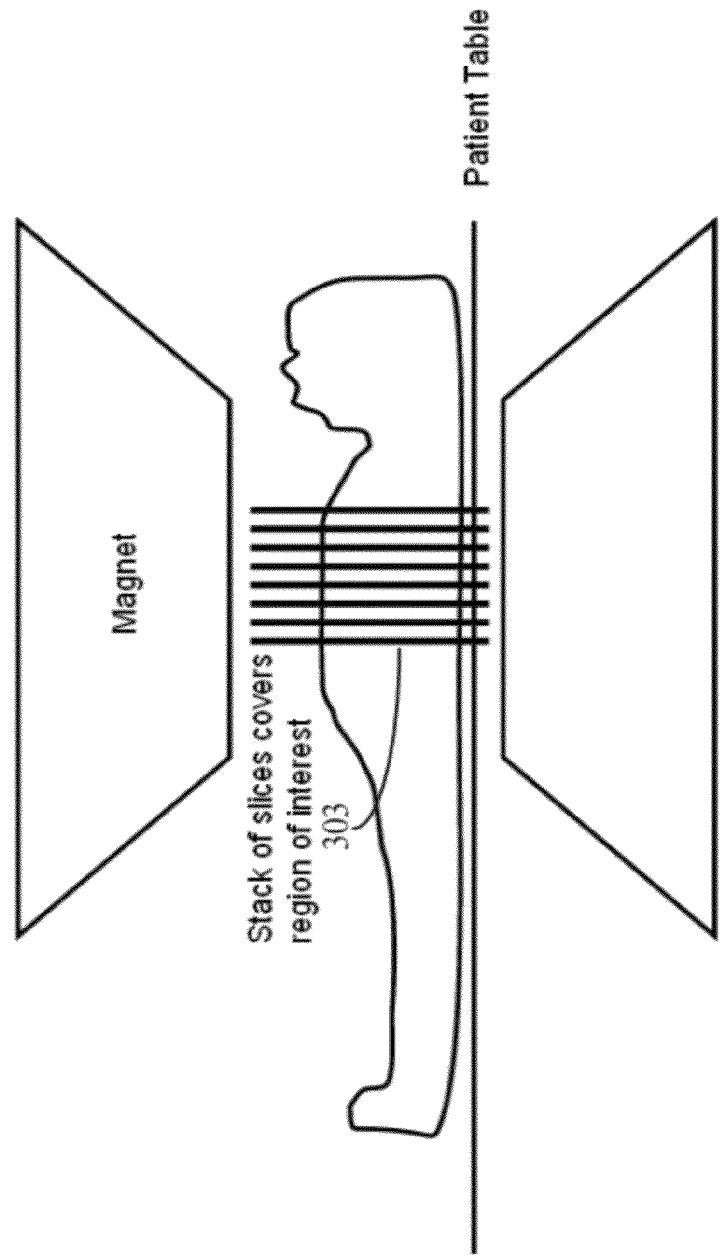
FIG. 3 shows an image slice configuration employed by a system for automatically dynamically compensating for inhomogeneity and variability in an MR imaging device magnetic field, according to invention principles.

FIG. 3 shows an image slice configuration employed by system 10 for automatically dynamically compensating for inhomogeneity and variability in an MR imaging device magnetic field. Specifically, stack of slices 303 is acquired (e.g., comprising slices 203, 205 and so on of FIG. 2) of a volume of interest using the process described in connection with FIG. 2. The slices are acquired with a patient breathing freely and in one embodiment, using relatively low image resolution acquisition.

Figure 4:
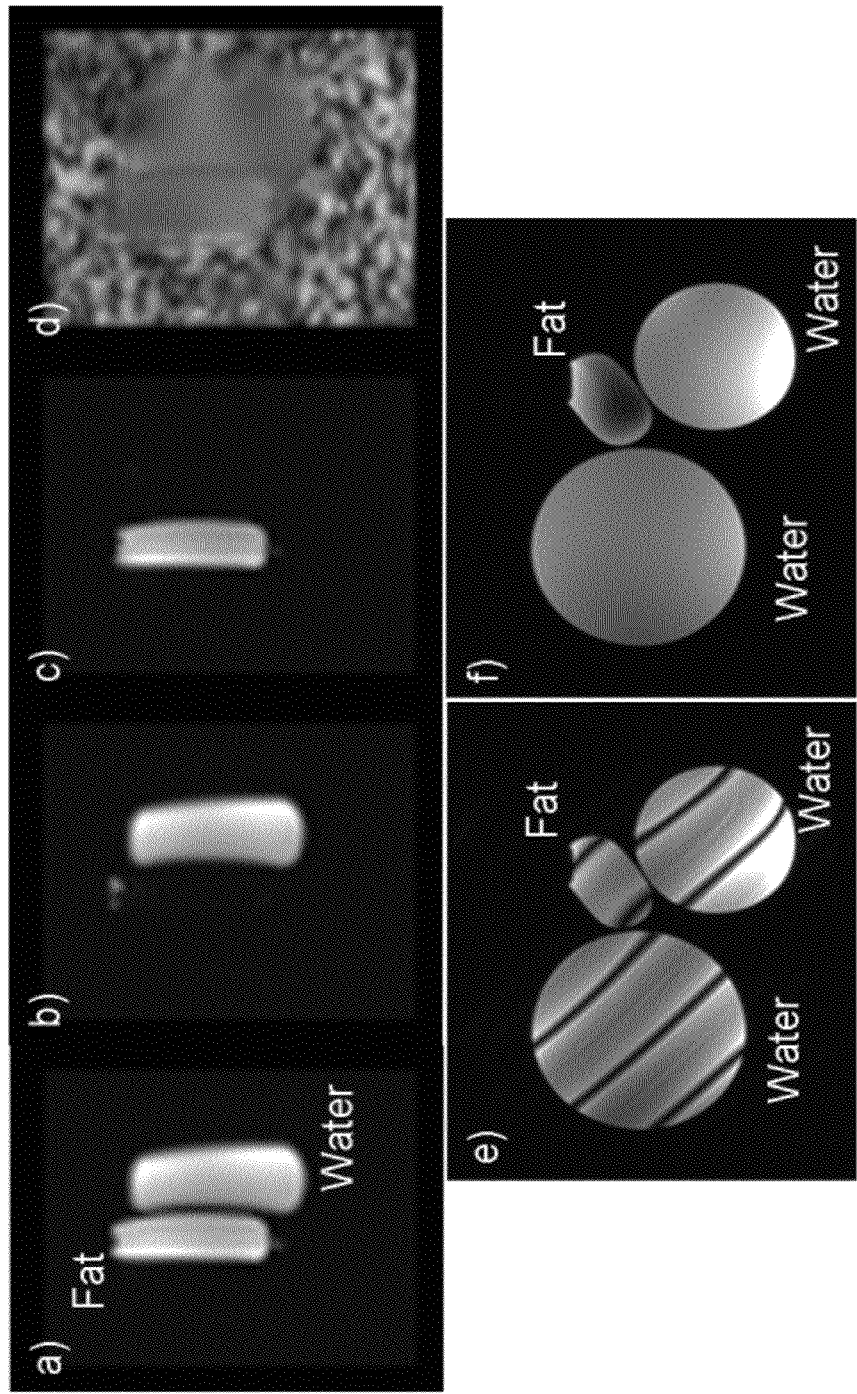
FIG. 4 illustrates shimming provided by a system for automatically dynamically compensating for inhomogeneity and variability in an MR imaging device magnetic field, according to invention principles.

FIG. 4 illustrates images acquired by system 10 using shimming compensation provided by MR imaging compensation system 34 for automatically dynamically compensating for inhomogeneity and variability in an MR imaging device magnetic field. FIG. 4 demonstrates shimming by compensation system 34 in a phantom experiment. FIGS. 4a, 4b, 4c, 4d, 4e and 4f show phantom image results for a system 34 shimming procedure. Specifically, FIGS. 4a-4f show individual slices of 24 saggittal slices which were acquired during a shimming procedure using 4-echo multi-slice single-shot GRE (gradient-recalled echo) protocol. The fat, water and field map images are calculated using a VARPRO reconstruction algorithm and include 4a) a fat-water combined image, 4b) a water image, 4c) a fat image and d) a corresponding magnetic field map image.

FIGS. 4e and 4f display a transverse slice acquired using a TrueFISP protocol. Specifically, FIG. 4e shows a TrueFISP image acquired using misadjusted shim currents and 4f shows a TrueFISP image acquired after recalculating shim currents based on the calculated magnetic field-map. For a demonstration illustrated in FIGS. 4e and 4f, two water bottles and a baby oil bottle were placed inside a 1.5T (Tesla) MR image scanner. Magnetic field shim currents were misadjusted intentionally and a transverse TrueFISP image with the mis-shim was acquired (FIG. 4e) illustrating mis-shim banding effects. Subsequently, 24 low resolution saggittal slices were acquired covering the volume of interest using a multi-echo GRE (gradient-recalled echo) sequence (N=4 echoes). Fat, water and field-map images were calculated using Equation 1 and a field image was reconstructed using a VARPRO algorithm. The shim currents were readjusted using this field-map and another transverse TrueFISP image was acquired at the same slice position using adapted shim settings as shown in FIG. 4f illustrating a corrected shim image without banding.

In the use of multi-echo GRE for water fat separation for cardiac applications using a multi-point Dixon method (Dixon WT. Simple proton spectroscopic imaging. Radiology 1984; 153:189-194), examples of application to late enhancement using multi-echo IR-GRE (inversion-recovery gradient-recalled echo) show improved operation. Another embodiment comprises a PSIR (Phase Sensitive Inversion Recovery) version. In the 3-point Dixon methods (such as VARPRO) with arbitrary echo times (TE), system 10 solves simultaneous equations (e.g., like, or derived from, equation 1) for fat and water (including partial volume pixels composed of a mixture) assuming that the static magnetic field of magnet 12 (FIG. 1) is known. System 10 iteratively performs a shimming procedure to update a magnetic field map estimate. Upon convergence of the fat water separation process, system 10 provides output data comprising a water image, fat image, and a spatially smoothed magnetic field map estimate. The magnetic field map estimate is relatively accurate and is not contaminated by the chemical shift of fat eliminating the problem of fat pixels which appear as off-resonance artifacts.

In cardiac applications such as late enhancement, a single-shot ("real-time") multi-echo GRE protocol is not triggered but is acquired free-breathing. Late enhancement (LE) of contrast agent in cardiac magnetic resonance imaging (MRI) is a characteristic finding in patients with cardiac amyloidosis (CA) and other conditions. In operation, system 10 repetitively acquires image data (with 10 iterations) for 3 patients to test consistency over a respiratory cycle and produces 10 corresponding magnetic field maps. System 10 reconstructs complex images comprising, water-fat separation and field map estimates using MATLAB™ code, for example. Some of the protocol parameters used are shown in Table I.

TABLE I

| | |
|---|---|
| tSequenceFileName = | "%SiemensSeq%\gre" |
| tProtocolName = | "real-time gre multiecho" |
| sProtConsistencyInfo.- | "N4_VB13A_LATEST_20060607" |
| tBaselineString = | |
| alTR[0] = | 7700 |
| lContrasts = | 3 |
| alTE[0] = | 1680 |
| alTE[1] = | 3810 |
| alTE[2] = | 5940 |
| sRXSPEC.alDwellTime[0] = | 3500 (approx 1100 Hz/px) |
| sRXSPEC.alDwellTime[1] = | 3500 |
| sRXSPEC.alDwellTime[2] = | 3500 |
| sSliceArray.asSlice[0].-dThickness = | 8 |
| sSliceArray.asSlice[0].-dPhaseFOV = | 285 |
| sSliceArray.asSlice[0].-dReadoutFOV = | 380 |
| sKSpace.lBaseResolution = | 128 |
| sKSpace.lPhaseEncodingLines = | 72 |
| sKSpace.dPhaseResolution = | 0.75 |
| lRepetitions = | 9 |
| adFlipAngleDegree[0] = | 20 |
| sPat.ucPATMode = | 0x1 (OFF) |

Temporal resolution, number of k-space lines*repetition time, derived from Table I, is 72*7.7=554.4 seconds. In the operation example, cardiac motion blurring occurred on each of the 3 patients studied but was below a threshold that would significantly impact magnetic field estimation and cause a problem.

Figure 5:
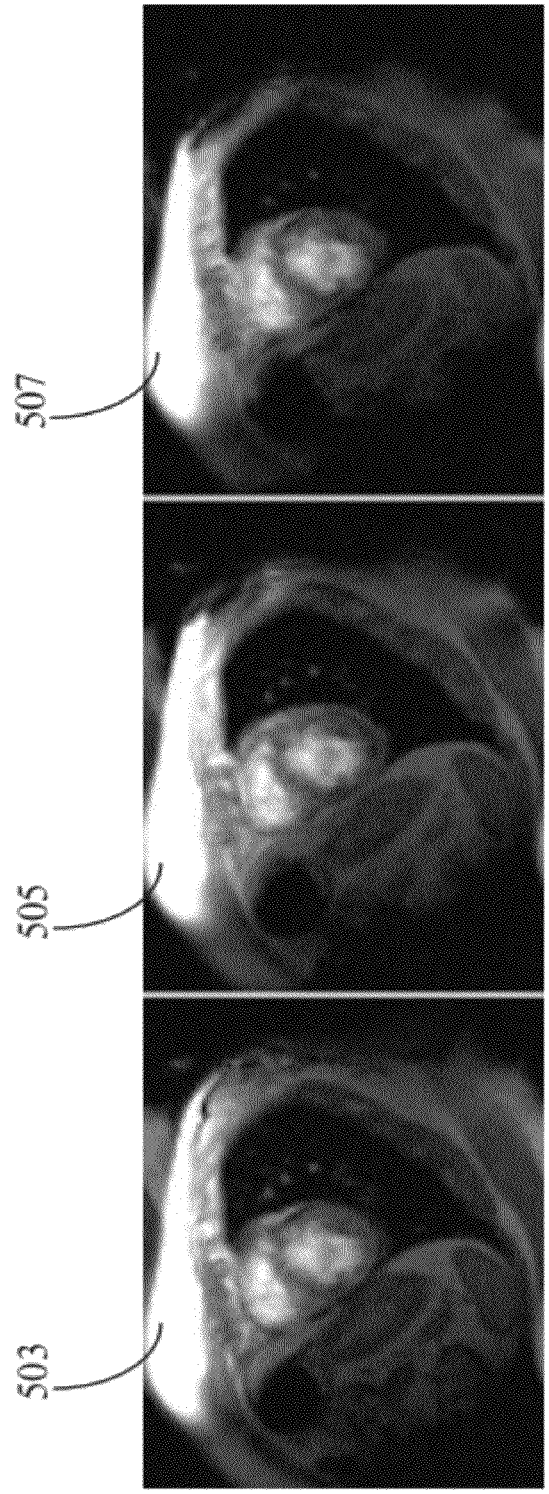
FIGS. 5 and 6 illustrate images acquired using shimming provided by a system, according to invention principles.
Figure 6:
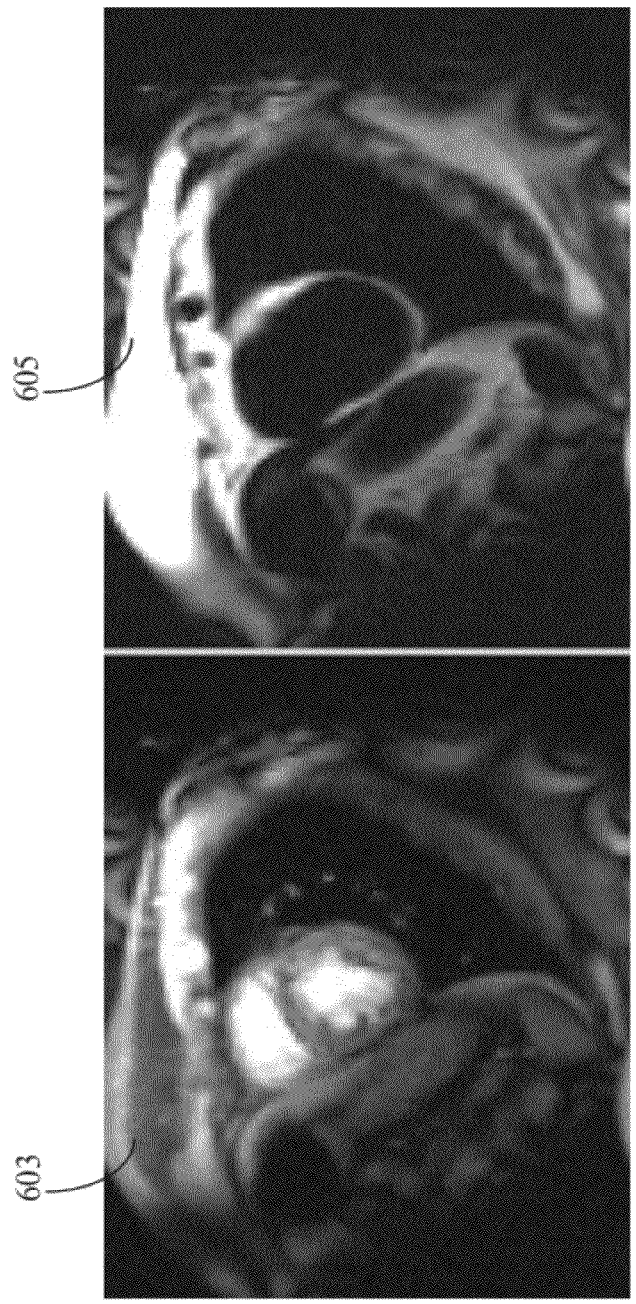

FIGS. 5 and 6 illustrate images acquired using shimming provided by system 10. FIG. 5 shows composite water plus fat magnetic magnitude images 503, 505 and 507 acquired for sequential echo times (TE) of an initial repetition time (TR). FIG. 6 shows water and fat separated images. Image 603 shows a water MR image and image 605 shows a fat MR image derived using Equation 1.

Figure 7:
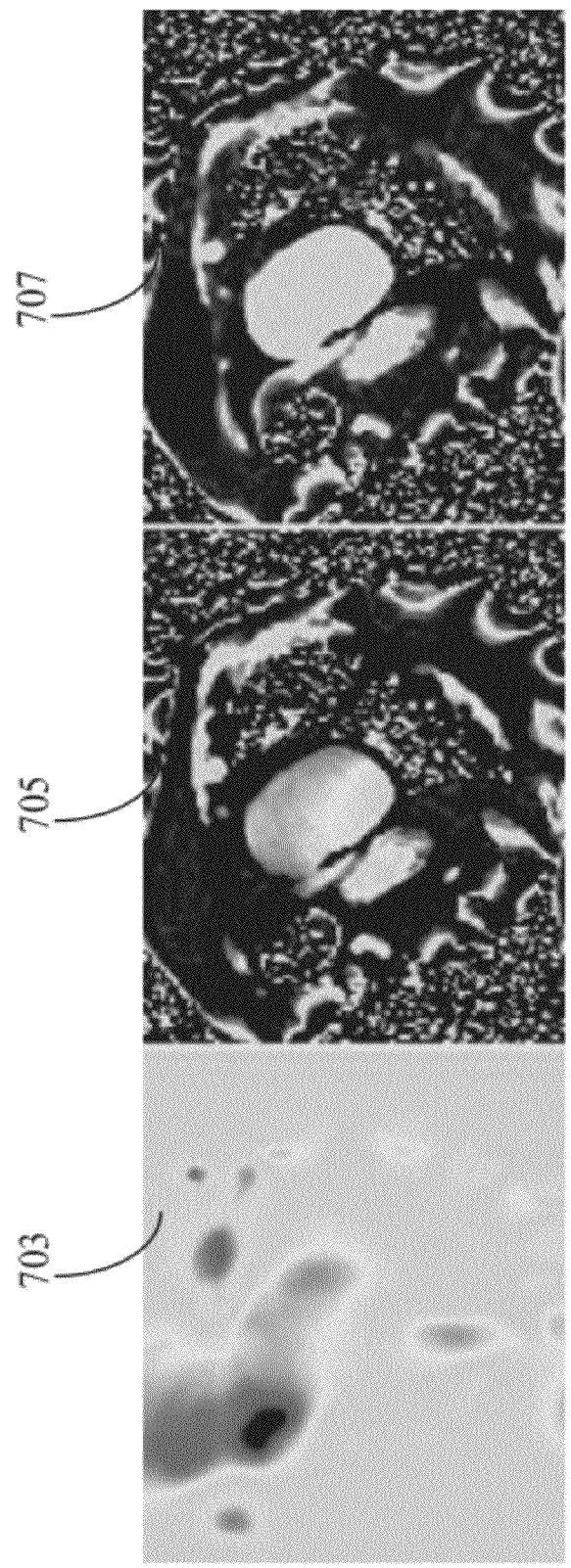
FIG. 7 illustrates magnetic field map estimates derived using shimming provided by a system, according to invention principles.

FIG. 7 illustrates magnetic field map estimates derived using shimming provided by system 10. Magnetic field map estimate image 703, is derived using a known VARPRO reconstruction algorithm and water fat separation method. Magnetic field map estimate image 705, is derived using a simple 2 echo phase difference. Magnetic field map estimate image 707, is derived using a difference. The difference between the simple method and the water-fat separated method was measured in the operation example to be within several Hz over a heart (blood and myocardium). Further, epicardial fat introduces a chemical shift seen as off-resonance in the simple 2-echo field map image 705.

Figure 8:
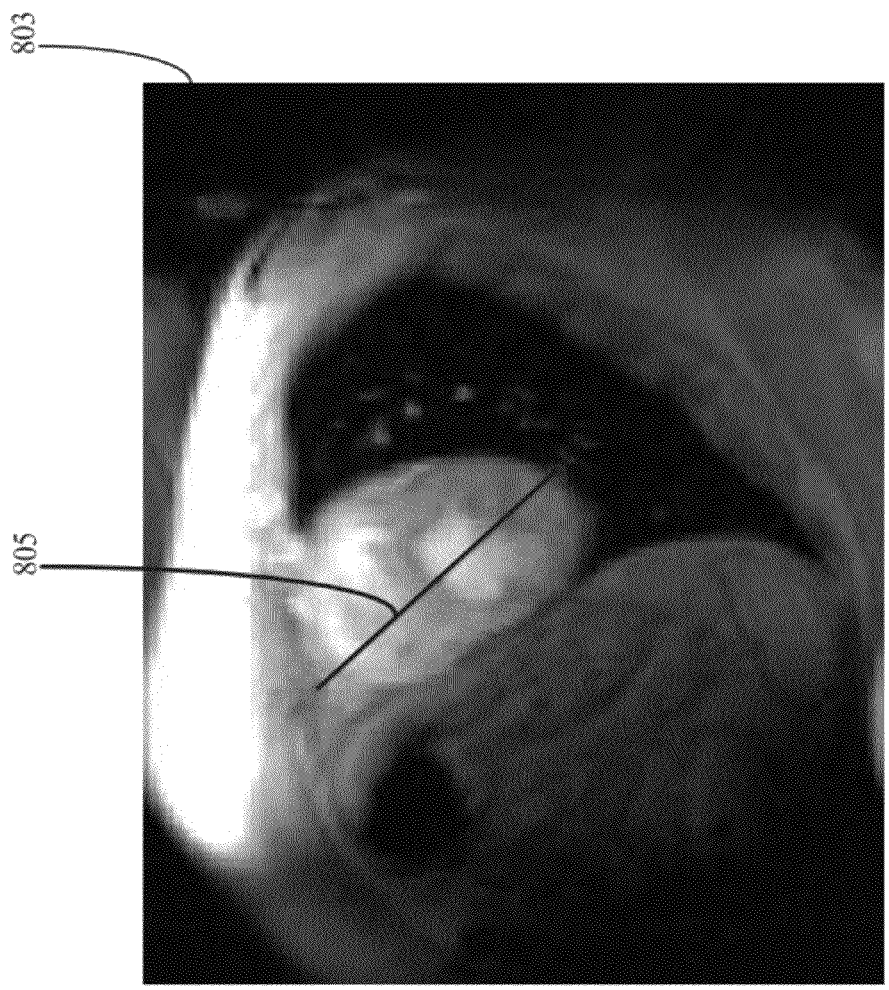
FIG. 8 illustrates a water plus fat magnetic field map derived using shimming provided by a system, according to invention principles.
Figure 9:
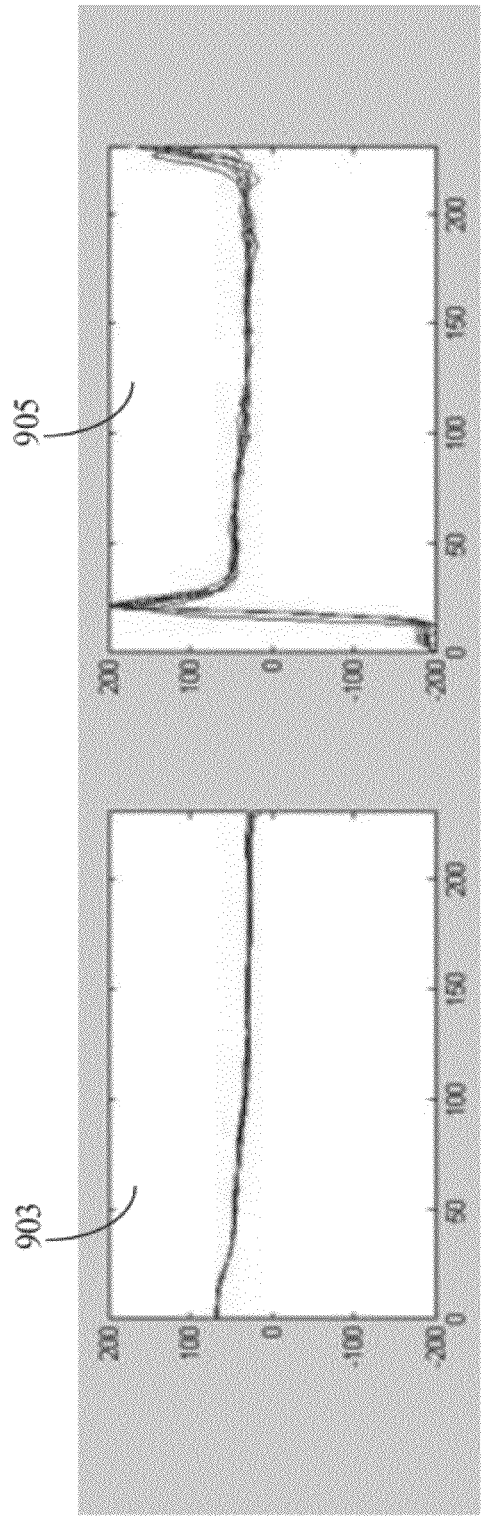
FIG. 9 illustrates magnetic field distortion (Hz, y-axis) versus position across image (mm) for an image with fat separated from water and for a two echo method, according to invention principles.

FIG. 8 illustrates a water plus fat magnetic field map derived using shimming provided by system 10. Specifically, image 803 is a composite water+fat magnetic field magnitude image. The effect of epicardial fat is seen more clearly by examining a profile of a magnetic field map which includes fat. FIG. 9 image 903 illustrates magnetic field distortion (Hz, y-axis) versus position across image (mm, x-axis) along line 805 of FIG. 8 for an image of water with fat separated out. Similarly, image 905 illustrates magnetic field distortion (Hz, y-axis) versus position across image (mm, x-axis) along line 805 of FIG. 8 acquired using a two echo method. Fat only pixels may be removed from a magnetic field map estimate used for deriving shimming currents, by image data processing to identify sharp luminance transitions, but this is difficult and is impaired by partial volume pixels.

Figure 10:
FIG. 10 illustrates a magnetic field distortion mask image derived for water plus fat, according to invention principles.

In order to illustrate the effects on a simple linear field map fit in a heart region, a threshold mask is generated by applying a threshold to the combined water+fat magnitude image of FIG. 8 to provide the image of FIG. 10. Specifically, FIG. 10 illustrates a magnetic field distortion mask image derived for water plus fat from image 803 (FIG. 8).

Figure 11:
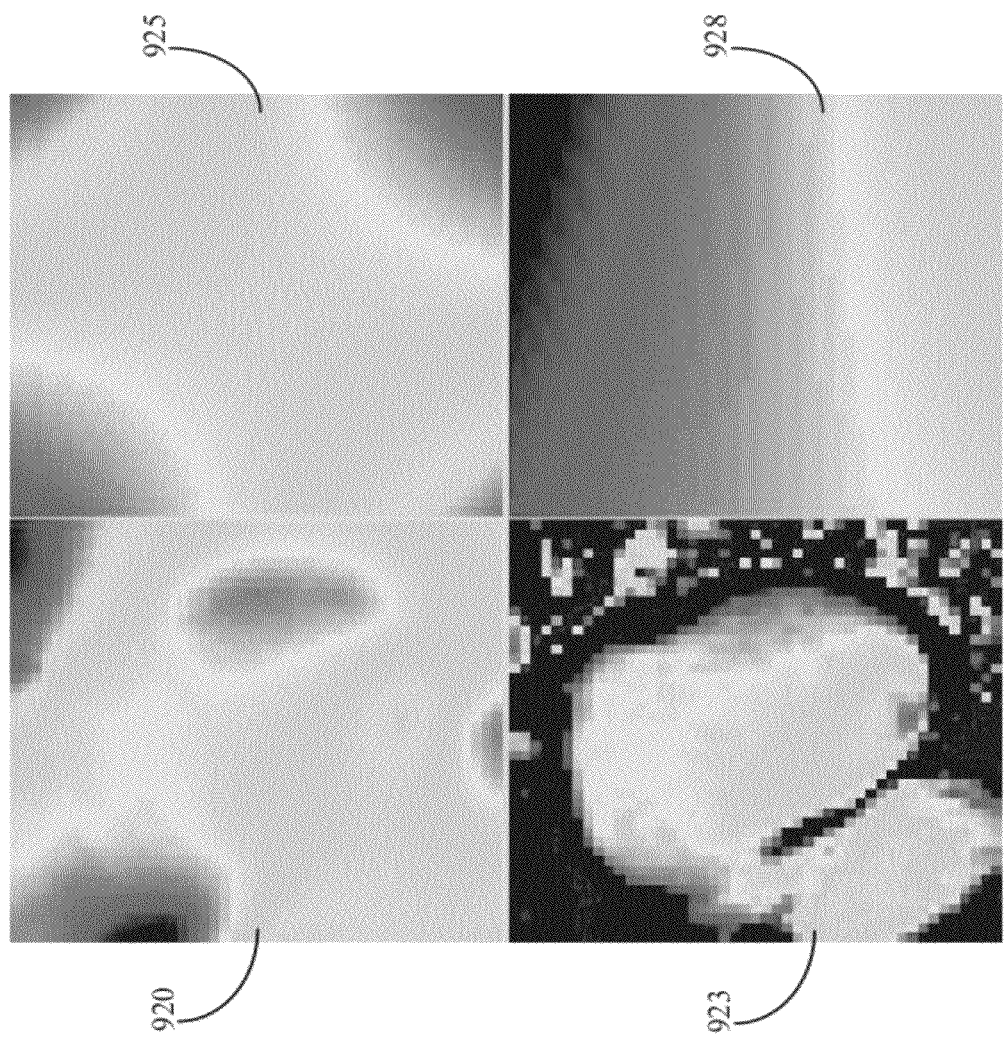
FIG. 11 illustrates a magnetic field map fit for water minus fat and for a two echo field map estimate, according to invention principles.

FIG. 11 illustrates a magnetic field map fit for water minus fat and for a two echo field map estimate. A two dimensional $1^{st}$ order (linear) polynomial surface fit is performed to the field map of FIG. 8 in the heart region (a rectangular ROI) where values below a threshold are excluded from the fit. However, since the mask includes epicardial fat, the fat is included in the fit. Image 925 shows a two dimensional linear fit to the water minus fat separated magnetic field map of image 920. Image 928 shows a two dimensional linear fit to the two echo magnetic field map estimate of image 923. The linear surface fit of image 925 follows the fieldmap reasonably over the heart region using the water fat separated field map estimate but does poorly in image 928 using the simpler method due to the presence of epicardial fat. The method for water fat separation used a VARPRO process but alternative processes may be used. A 2-point Dixon water-fat method is usable, for example, to produce a water only magnetic field map.

System 10 derives data representing an electrical signal to be applied to magnetic field generation coils as described in Appendix A, to substantially compensate for the derived off-set frequencies in the anatomical region of interest corresponding to the multiple image element locations by calculation of shimming currents using one of a variety of known methods. Such known methods are indicated in Optimization of Static Magnetic Field Homogeneity in the Human and Animal Brain in Vivo, by K. M. Koch et al published 2009 pages 69-96 of Progress in Nuclear Magnetic Resonance Spectroscopy 54, for example.

Figure 12:
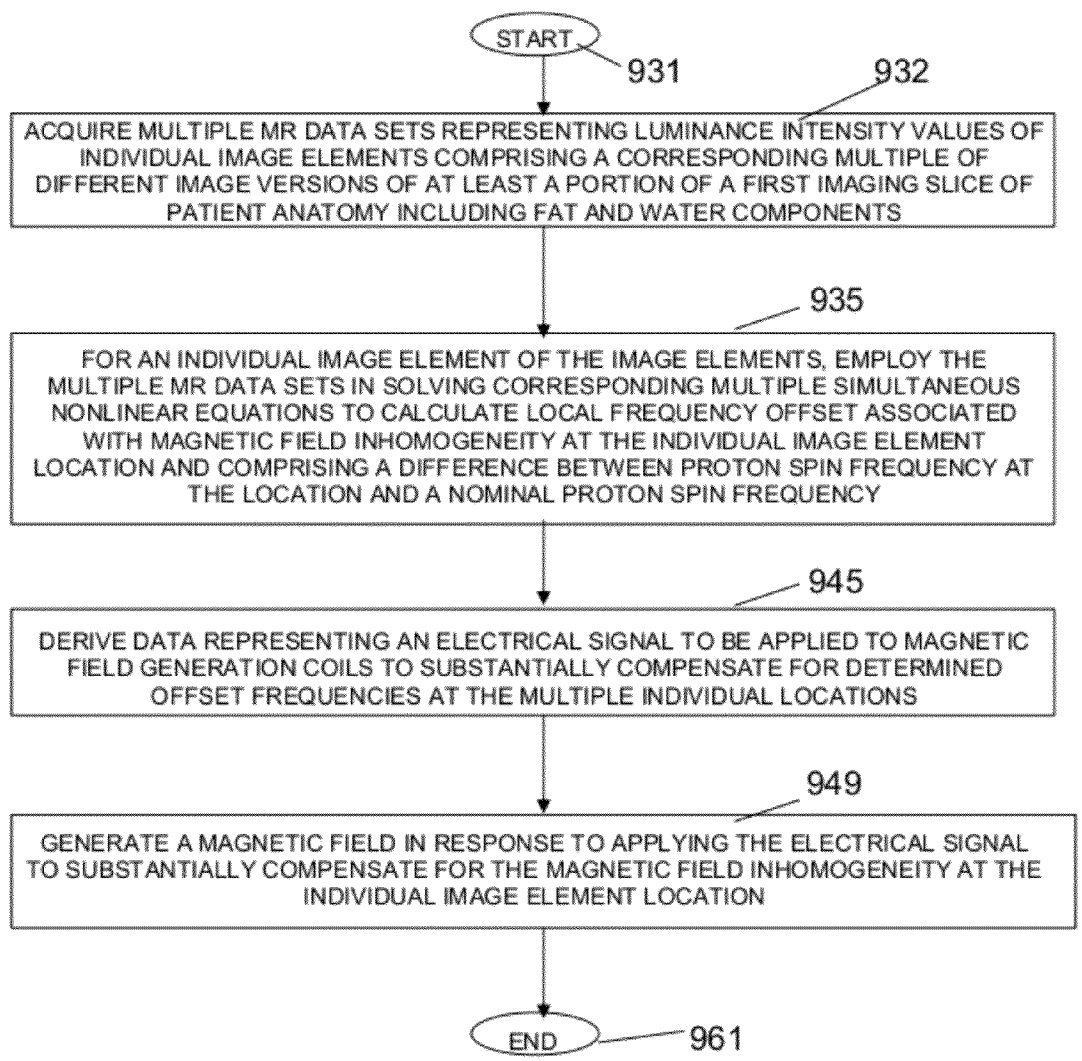
FIG. 12 shows a flowchart of a process performed by a system for automatically dynamically compensating for inhomogeneity and variability in an MR imaging device magnetic field, according to invention principles.

FIG. 12 shows a flowchart of a process performed by system 10 for automatically dynamically compensating for inhomogeneity and variability in an MR imaging device magnetic field. In step 932 following the start at step 931, MR imaging compensation system 34 (FIG. 1) acquires multiple (at least three) MR data sets representing luminance intensity values of individual image elements comprising corresponding multiple different image versions of at least a portion of a first imaging slice of patient anatomy including fat and water components. The MR imaging compensation system acquires the multiple MR data sets using a multi-echo pulse sequence such as a double echo steady state (DESS) sequence, for example. In step 935, for an individual image element of the image elements, MR imaging compensation system 34 employs the multiple MR data sets and iterative computerized analysis in solving the corresponding multiple (at least three) simultaneous nonlinear equations (of the form of Equation 1) to calculate local frequency offset associated with magnetic field inhomogeneity at the individual image element location and comprising a difference between proton spin frequency at the location and a nominal proton spin frequency. An individual image element comprises at least one of, (a) an individual pixel, (b) a group of individual pixels, (c) an individual voxel and (d) a group of individual voxels.

The MR imaging compensation system solves the corresponding multiple simultaneous nonlinear equations to calculate variables including, (i) luminance intensity of a water component and (ii) luminance intensity of a fat component. The MR imaging compensation system calculates a local frequency offset associated with magnetic field inhomogeneity at the individual image element locations comprising at least a portion of the first imaging slice. In step 945 MR imaging compensation system 34 derives data representing an electrical signal to be applied to magnetic field generation coils to substantially compensate for determined offset frequencies at multiple individual locations including at the individual element location. The electrical signal comprises at least one of, (a) a current and (b) a voltage, applied to a magnetic field generation coil. Magnet field coils 14 in step 949 generate a magnetic field in response to applying the electrical signal to substantially compensate for the magnetic field inhomogeneity at the individual image element location. The process of FIG. 12 terminates at step 961.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A display processor or generator is a known element comprising electronic circuitry or software or a combination of both for generating display images or portions thereof.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-12 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses magnetic field map magnitude and phase information present in N+1 echoes to estimate magnetic field for N chemical species and provide an accurate magnetic field map of local field inhomogeneities to perform a shimming procedure of the static magnetic field in a region of interest (ROI). Further, the processes and applications may, in alternative embodiments, be located on one or more (e.g., distributed) processing devices on the network of FIG. 1. Any of the functions and steps provided in FIGS. 1-12 may be implemented in hardware, software or a combination of both.

APPENDIX A

Calculation of Compensatory Shim Currents and Active Shimming

Once background off-resonance frequency ($\Delta f_B$) is estimated, background field variation can be estimated as $$\Delta B_0 = \frac{2\pi}{\gamma} \Delta f_B$$

After the field variation is estimated, next step is to correct this over a chosen region of interest. In-vivo systems typically contain $2^{nd}$ order shim-coils for the purpose of compensating this field variation. The normalized field distribution $M_j$ of these shim-coils can be approximated in the first 8 Legendre terms:

| Kanal | Feld | | dM/dx | dM/dy | dM/dz |
|---|---|---|---|---|---|
| $M_1$ | $A_{11}$ | x | 1 | 0 | 0 |
| $M_2$ | $B_{11}$ | y | 0 | 1 | 0 |
| $M_3$ | $A_{10}$ | z | 0 | 0 | 1 |
| $M_4$ | $A_{20}$ | $z^2 - \frac{x^2 + y^2}{2}$ | $-x$ | $-y$ | $2z$ |
| $M_5$ | $A_{21}$ | xz | z | 0 | x |

-continued

| Kanal | Feld | dM/dx | dM/dy | dM/dz |
|---|---|---|---|---|
| $M_6$ | $B_{21}$ | yz | 0 | z | y |
| $M_7$ | $A_{22}$ | $\frac{x^2 - y^2}{2}$ | x | -y | 0 |
| $M_8$ | $B_{22}$ | xy | y | x | 0 |

The goal here is to calculate shimming current for each shim-coil which generate additional fields (described using terms above) to compensate the background field variation $\Delta B_0$.

For discussions below, $B_0$ is used instead of $\Delta B_0$ for the sake of brevity.

The algorithm below briefly describes the procedure to obtain the needed current $I_j$ for each channel. Each channel generates a field $dB_j = M_j * P_j * I_j$. The goal is to find a set of I that smoothes the magnetic field (P=spatially independent channel sensitivity):

$$\min_{I_j} \left\| \sum_{j=1}^{N} M_j(\vec{r}) P_j I_j - B_0(\vec{r}) \right\|$$

For mathematical reasons the problem can be rewritten as a differential equation $$\min_{I_j} \left\| \begin{array}{c} \sum_{j=1}^{N} \frac{dM_j(\vec{r})}{dx} P_j I_j - \frac{dB_0(\vec{r})}{dx} \\ \sum_{j=1}^{N} \frac{dM_j(\vec{r})}{dy} P_j I_j - \frac{dB_0(\vec{r})}{dy} \\ \sum_{j=1}^{N} \frac{dM_j(\vec{r})}{dz} P_j I_j - \frac{dB_0(\vec{r})}{dz} \end{array} \right\|$$

Using approximations of the differential obtained from the measured 3D data $$\frac{dB_0(\vec{r})}{dx} = \frac{\arg\left(S\left(\vec{r} + \frac{\Delta\vec{x}}{2}\right) S^*\left(\vec{r} - \frac{\Delta\vec{x}}{2}\right)\right)}{\gamma \Delta T_E |\Delta\vec{x}|}$$

$$\frac{dB_0(\vec{r})}{dy} = \frac{\arg\left(S\left(\vec{r} + \frac{\Delta\vec{y}}{2}\right) S^*\left(\vec{r} - \frac{\Delta\vec{y}}{2}\right)\right)}{\gamma \Delta T_E |\Delta\vec{y}|}$$

$$\frac{dB_0(\vec{r})}{dz} = \frac{\arg\left(S\left(\vec{r} + \frac{\Delta\vec{z}}{2}\right) S^*\left(\vec{r} - \frac{\Delta\vec{z}}{2}\right)\right)}{\gamma \Delta T_E |\Delta\vec{z}|}$$

The impact of noise on the dataset is inversely proportional to the signal intensity of data. Therefore, the equations could be weighted using the magnitude of measured signal intensity S and re-written as, $$\min_{I_j} \left\| \begin{array}{c} D_x(\vec{r}) \left( \sum_{j=1}^{N} \frac{dM_j(\vec{r})}{dx} P_j I_j - \frac{dB_0(\vec{r})}{dx} \right) \\ D_y(\vec{r}) \left( \sum_{j=1}^{N} \frac{dM_j(\vec{r})}{dy} P_j I_j - \frac{dB_0(\vec{r})}{dy} \right) \\ D_z(\vec{r}) \left( \sum_{j=1}^{N} \frac{dM_j(\vec{r})}{dz} P_j I_j - \frac{dB_0(\vec{r})}{dz} \right) \end{array} \right\|$$

Where the weighting factors are describe by, $$D_x(\vec{r}) = \sqrt{\left\| S\left(\vec{r} - \frac{\Delta\vec{x}}{2}\right) S\left(\vec{r} + \frac{\Delta\vec{x}}{2}\right) \right\|}$$

$$D_y(\vec{r}) = \sqrt{\left\| S\left(\vec{r} - \frac{\Delta\vec{y}}{2}\right) S\left(\vec{r} + \frac{\Delta\vec{y}}{2}\right) \right\|}$$

$$D_z(\vec{r}) = \sqrt{\left\| S\left(\vec{r} - \frac{\Delta\vec{z}}{2}\right) S\left(\vec{r} + \frac{\Delta\vec{z}}{2}\right) \right\|}.$$

This defines an over defined system of equations (8 unknown but typically $3 \times 31^3$ equations for a $32 \times 32 \times 32$ data set) that can be solved using a known QR approach. Once a system of/is calculated, these currents can be applied in the shim-coils to homogenize the region-of-interest in the imaging volume.

What is claimed is:

1. A system for automatically dynamically compensating for inhomogeneity and variability in an MR imaging device magnetic field resulting from patient anatomical variation and other sources, comprising:
    an MR imaging compensation system for,
        acquiring a plurality of MR data sets representing luminance intensity values of individual image elements comprising a corresponding plurality of different image versions of at least a portion of a first imaging slice of patient anatomy including fat and water components,
        for an individual image element of said image elements, employing said plurality of MR data sets in solving a corresponding plurality of simultaneous nonlinear equations to calculate local frequency offset associated with magnetic field inhomogeneity at the individual image element location and comprising a difference between proton spin frequency at the location and a nominal proton spin frequency,
    deriving data representing an electrical signal to be applied to magnetic field generation coils to substantially compensate for determined offset frequencies at a plurality of individual locations including at said individual element location; and
    a magnetic field generation coil for generating a magnetic field in response to applying said electrical signal to substantially compensate for the magnetic field inhomogeneity at said individual image element location.

2. A system according to claim 1, wherein said electrical signal comprises at least one of, (a) a current and (b) a voltage, applied to the magnetic field generation coil.

3. A system according to claim 1, wherein
said MR imaging compensation system solves said corresponding plurality of simultaneous nonlinear equations to calculate variables including,
(i) luminance intensity of a water component and
(ii) luminance intensity of a fat component.

4. A system according to claim 1, wherein
said MR imaging compensation system calculates a local frequency offset associated with magnetic field inhomogeneity at the individual image element locations comprising the at least a portion of the first imaging slice.

5. A system according to claim 1, wherein
said MR imaging compensation system employs said plurality of MR data sets in solving at least three simultaneous nonlinear equations to calculate local frequency offset associated with magnetic field inhomogeneity at the individual image element location.

6. A system according to claim 1, wherein
said MR imaging compensation system employs iterative computerized analysis in solving the simultaneous nonlinear equations.

7. A system according to claim 1, wherein
said MR imaging compensation system employs simultaneous nonlinear equations of the form, $$s(t_n) = \rho_w e^{i2\pi \Delta f B t_n} + \rho_f e^{i2\pi(\Delta f B + \Delta f_f) t_n}$$

Where s represents luminance intensity, $t_n$ is echo time, $\rho_w$ is luminance intensity of a water component, $\rho_f$ is luminance intensity of a fat component having a known frequency shift $\Delta f_f$ (in Hz) and $\Delta f_B$ is the local frequency offset due to field inhomogeneity.

8. A system according to claim 1, wherein
an individual image element comprises at least one of, (a) an individual pixel, (b) a group of individual pixels, (c) an individual voxel and (d) a group of individual voxels.

9. A system according to claim 1, wherein
said MR imaging compensation system acquires said plurality of MR data sets using a multi-echo pulse sequence.

10. A system according to claim 9, wherein
said multi-echo pulse sequence is a double echo steady state (DESS) sequence.

11. A system for automatically dynamically compensating for inhomogeneity and variability in an MR imaging device magnetic field resulting from patient anatomical variation and other sources, comprising:
an MR imaging compensation system for automatically,
acquiring at least three MR data sets representing luminance intensity values of individual image elements comprising a corresponding plurality of different image versions of at least a portion of a first imaging slice of patient anatomy including fat and water components,
for an individual image element of said image elements, employing said at least three MR data sets in iteratively solving a corresponding at least three simultaneous nonlinear equations to calculate local frequency offset associated with magnetic field inhomogeneity at the individual image element location and comprising a difference between proton spin frequency at the location and a nominal proton spin frequency,
deriving data representing an electrical signal to be applied to magnetic field generation coils to substantially compensate for determined offset frequencies at a plurality of individual locations including at said individual element location; and
a magnetic field generation coil for generating a magnetic field in response to applying said electrical signal to substantially compensate for the magnetic field inhomogeneity at said individual image element location.

12. A system according to claim 11, wherein
said MR imaging compensation system solves said corresponding plurality of simultaneous nonlinear equations to calculate variables including,
(i) luminance intensity of a water component and
(ii) luminance intensity of a fat component.

13. A system according to claim 11, wherein
said MR imaging compensation system calculates a local frequency offset associated with magnetic field inhomogeneity at the individual image element locations comprising the at least a portion of the first imaging slice.

14. A system according to claim 11, wherein
said MR imaging compensation system acquires said plurality of MR data sets using a multi-echo pulse sequence.

15. A method for automatically dynamically compensating for inhomogeneity and variability in an MR imaging device magnetic field resulting from patient anatomical variation and other sources, comprising the activities of:
acquiring a plurality of MR data sets representing luminance intensity values of individual image elements comprising a corresponding plurality of different image versions of at least a portion of a first imaging slice of patient anatomy including fat and water components;
for an individual image element of said image elements, employing said plurality of MR data sets in solving a corresponding plurality of simultaneous nonlinear equations to calculate local frequency offset associated with magnetic field inhomogeneity at the individual image element location and comprising a difference between proton spin frequency at the location and a nominal proton spin frequency;
deriving data representing an electrical signal to be applied to magnetic field generation coils to substantially compensate for determined offset frequencies at a plurality of individual locations including at said individual element location; and
generating a magnetic field in response to applying said electrical signal to substantially compensate for the magnetic field inhomogeneity at said individual image element location.

* * * * *